US012604734B2

(12) United States Patent
Chiang et al.

(10) Patent No.: US 12,604,734 B2
(45) Date of Patent: Apr. 14, 2026

(54) INTEGRATED CIRCUIT PACKAGES AND METHODS

(71) Applicant: Taiwan Semiconductor Manufacturing Co., Ltd., Hsinchu (TW)

(72) Inventors: Yi-Che Chiang, Hsinchu (TW); Yuan Sheng Chiu, Miaoli (TW); Hong-Yu Guo, Hsinchu (TW); Hsin-Yu Pan, Taipei (TW); Tsung-Shu Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 532 days.

(21) Appl. No.: 18/151,545

(22) Filed: Jan. 9, 2023

(65) Prior Publication Data

US 2024/0234340 A1 Jul. 11, 2024

(51) Int. Cl.
H01L 25/10 (2006.01)
H01L 23/00 (2006.01)
(Continued)

(52) U.S. Cl.
CPC ............ H01L 23/562 (2013.01); H01L 24/13 (2013.01); H01L 24/16 (2013.01); H01L 24/32 (2013.01); H01L 24/73 (2013.01); H01L 24/83 (2013.01); H01L 25/105 (2013.01); H01L 25/18 (2013.01); H01L 25/50 (2013.01); H10B 80/00 (2023.02); H01L 24/05 (2013.01); H01L 24/06 (2013.01); H01L 24/08 (2013.01); H01L 24/80 (2013.01); H01L 24/81 (2013.01);

*H01L 24/92* (2013.01); *H01L 2224/0401* (2013.01); *H01L 2224/0557* (2013.01); *H01L 2224/05624* (2013.01); *H01L 2224/05647* (2013.01); *H01L 2224/05666* (2013.01); *H01L 2224/05684* (2013.01); *H01L 2224/0603* (2013.01); *H01L 2224/06181* (2013.01); *H01L 2224/06517* (2013.01); *H01L 2224/08147* (2013.01); *H01L 2224/13109* (2013.01); *H01L 2224/13111* (2013.01); *H01L 2224/13116* (2013.01);
(Continued)

(58) Field of Classification Search
CPC .................................................... H01L 23/562
See application file for complete search history.

(56) References Cited

U.S. PATENT DOCUMENTS 6,570,259 B2 * 5/2003 Alcoe ..................... H01L 23/16
257/737
8,993,380 B2 3/2015 Hou et al.
(Continued)

*Primary Examiner* — William A Harriston
(74) *Attorney, Agent, or Firm* — Slater Matsil, LLP

(57) ABSTRACT

An integrated circuit package with a perforated stiffener ring and the method of forming the same are provided. The integrated circuit package may comprise an integrated circuit package component having an integrated circuit die on a substrate, an underfill between the integrated circuit package component and the substrate, and a stiffener ring attached to the substrate. The stiffener ring may encircle the integrated circuit package component and the underfill in a top-down view. The stiffener ring may comprise a perforated region, wherein the perforated region may comprise an array of openings extending from a top surface of the stiffener ring to a bottom surface of the stiffener ring.

20 Claims, 16 Drawing Sheets

(51) Int. Cl.
    *H01L 25/00*       (2006.01)
    *H01L 25/18*       (2023.01)
    *H10B 80/00*       (2023.01)

(52) U.S. Cl.
    CPC ............... *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16147* (2013.01); *H01L 2224/16227* (2013.01); *H01L 2224/32145* (2013.01); *H01L 2224/32225* (2013.01); *H01L 2224/73204* (2013.01); *H01L 2224/80357* (2013.01); *H01L 2224/80379* (2013.01); *H01L 2224/80895* (2013.01); *H01L 2224/80896* (2013.01); *H01L 2224/81191* (2013.01); *H01L 2224/81815* (2013.01); *H01L 2224/83102* (2013.01); *H01L 2224/92125* (2013.01); *H01L 2224/9222* (2013.01); *H01L 2924/0544* (2013.01); *H01L 2924/05494* (2013.01)

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2002/0060084 A1* | 5/2002 | Hilton | H01L 23/24 |
| | | | 257/E21.503 |
| 2011/0147912 A1* | 6/2011 | Karpur | H01L 21/563 |
| | | | 257/E23.129 |
| 2011/0253428 A1* | 10/2011 | Lim | H01L 21/563 |
| | | | 174/255 |
| 2015/0262900 A1* | 9/2015 | Wang | H01L 23/3675 |
| | | | 438/126 |
| 2017/0018505 A1 | 1/2017 | Lin et al. | |
| 2022/0013475 A1* | 1/2022 | Kim | H01L 25/0652 |
| 2022/0013487 A1 | 1/2022 | Kim | |
| 2024/0332212 A1* | 10/2024 | Lin | H10B 80/00 |

\* cited by examiner

INTEGRATED CIRCUIT PACKAGES AND METHODS

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
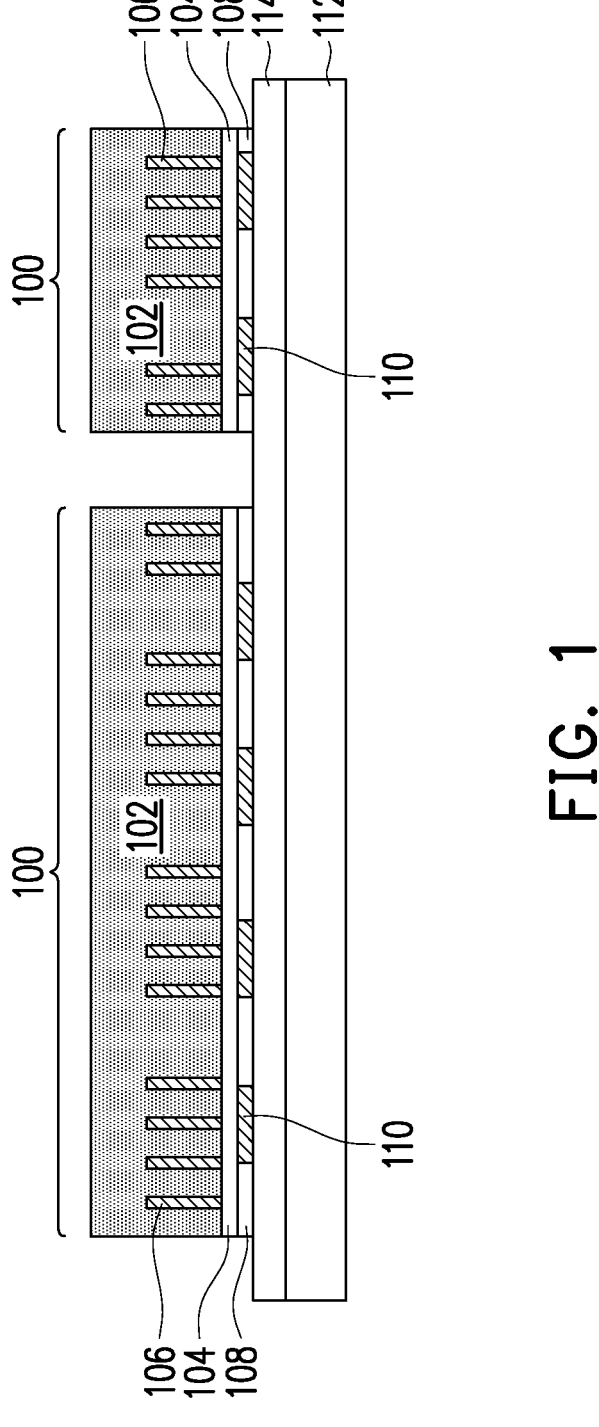
FIGS. 1, 2, 3, 4, 5, 6, 7, 8, 9, 10, 11, 12, 13A, 13B, 14, and 15 illustrate cross-sectional views and top-down views of intermediate stages in the formation of an integrated circuit package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit package with a perforated stiffener ring and the method of forming the same are provided. In accordance with some embodiments, an integrated circuit package comprises an integrated circuit package component and a perforated stiffener ring attached to a package substrate. The integrated circuit package component may comprise one or more integrated circuit dies. The perforated stiffener ring is attached to the substrate and encircles the integrated circuit package component. The perforated stiffener ring has reduced stiffness and/or hardness in perforated regions so that the risk of the cracking of the electrical connectors adjacent the perforated regions is reduced during the manufacturing and operation of the integrated circuit package, which improves the reliability of the integrated circuit package.

Referring first to FIG. 1, lower integrated circuit dies 100 are attached to a carrier 112 by an adhesive 114. The carrier 112 may be a semiconductor carrier, a glass carrier, a ceramic carrier, or the like. The carrier 112 may be a wafer. In some embodiments, the adhesive 114 is a thermal-release layer, such as an epoxy-based light-to-heat-conversion (LTHC) release material, which loses its adhesive property when heated. In some embodiments, the adhesive 114 is a UV glue, which loses its adhesive property when exposed to UV light. The layout of the integrated circuit dies 100 over the carrier 112 shown in FIG. 1 is an example, other layouts are contemplated.

Each lower integrated circuit die 100 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), the like, or combinations thereof.

Each lower integrated circuit die 100 may have a semiconductor substrate 102, such as silicon, doped or undoped, or an active layer of a semiconductor-on-insulator (SOI) substrate. The semiconductor substrate 102 may include other semiconductor materials, such as germanium, silicon carbide, gallium arsenic, gallium phosphide, indium phosphide, indium arsenide, indium antimonide, SiGe, GaAsP, AlInAs, AlGaAs, GaInAs, GaInP, and/or GaInAsP, or combinations thereof. Other substrates, such as multi-layered or gradient substrates, may also be used. The semiconductor substrate 102 may have an active surface (e.g., the surface facing downwards in FIG. 1), which may be called a front side, and an inactive surface (e.g., the surface facing upwards in FIG. 1), which may be called a back side.

Devices (not separately illustrated) may be disposed at the active surface of the semiconductor substrate 102. The devices may be active devices (e.g., transistors, diodes, etc.), capacitors, resistors, or the like. An interconnect structure 104 may be disposed over the active surface of the semiconductor substrate 102. The interconnect structure 104 may interconnect the devices to form an integrated circuit. The interconnect structure 104 may be formed of metallization patterns (not separately shown) in dielectric layers (not separately shown). The dielectric layers may be low-k dielectric layers. The metallization patterns may include metal lines and vias, which may be formed in the dielectric layers by a damascene process, such as a single damascene process, a dual damascene process, or the like. The metallization patterns may be formed of a suitable conductive material, such as copper, tungsten, aluminum, silver, gold, a combination thereof, or the like. The metallization patterns are electrically coupled to the devices.

Conductive vias 106 may be disposed in the semiconductor substrate 102. The conductive vias 106 may be electrically coupled to the metallization patterns of the interconnect structure 104. The semiconductor substrate 102 may be thinned in a subsequent process to expose the conductive vias 106 at the inactive surface of the semiconductor substrate 102. After the thinning process, the conductive vias 106 may be through-substrate vias (TSV), such as through-silicon vias. In some embodiments, the conductive vias 106 may be formed by a via-first process, such that the conductive vias 106 may extend into the semiconductor substrate 102 but not the interconnect structure 104. The conductive vias 106 formed by a via-first process may be connected to a lower metallization pattern (e.g., closer to the semiconductor substrate 102) of the interconnect structure 104. In some embodiments, the conductive vias 106 may be formed by a via-middle process, such that the conductive vias 106 may extend through a portion of the interconnect structure 104 and into the semiconductor substrate 102. The conductive vias 106 formed by a via-middle process may be connected to a middle metallization pattern of the interconnect structure 104. In some embodiments, the conductive vias 106 may be formed by a via-last process, such that the conductive vias 106 may extend through an entirety of the interconnect structure 104 and into the semiconductor substrate 102. The conductive vias 106 formed by a via-last process may be connected to an upper metallization pattern (e.g., further from the semiconductor substrate 102) of the interconnect structure 104.

A bonding layer 108 may be disposed on the interconnect structure at the front side of each lower integrated circuit die 100. The bonding layer 108 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as polybenzoxazole (PBO), polyimide, a BCB-based polymer, or the like; a combination thereof; or the like. The bonding layer 108 may be formed by chemical vapor deposition (CVD), atomic layer deposition (ALD), spin coating, lamination, or the like. One or more passivation layer(s) (not separately illustrated) may be disposed between the bonding layer 108 and the interconnect structure 104.

Die connectors 110 may extend through the bonding layer 108. The die connectors 110 may include conductive pillars, pads, or the like, to which external connections can be made. In some embodiments, the die connectors 110 include bond pads at the front side of the lower integrated circuit die 100 and vias that connect the bond pads to the upper metallization pattern of the interconnect structure 104. In such embodiments, the die connectors 110, including the bond pads and the vias, may be formed by a damascene process, such as a single damascene process, a dual damascene process, or the like. The die connectors 110 may be formed of a conductive material, such as copper, aluminum, or the like, by a technique, such as plating or the like.

Figure 2:
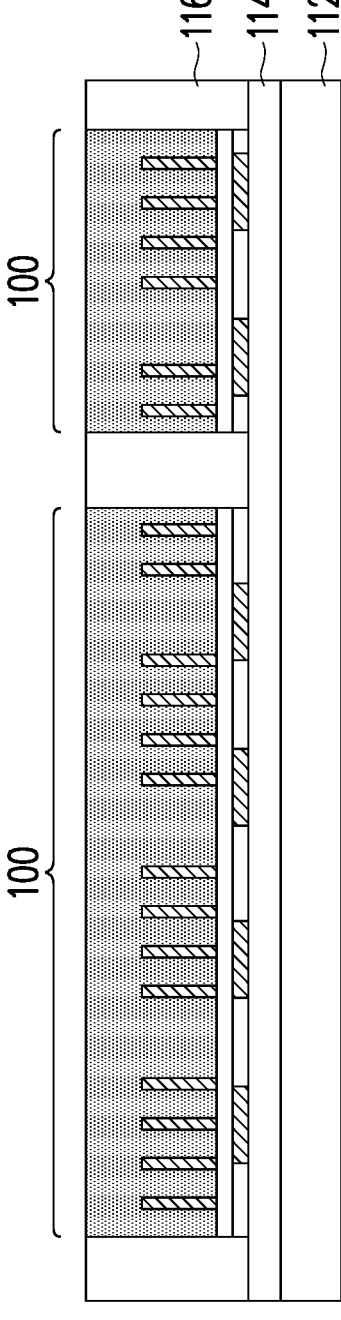

In FIG. 2, a gap-fill layer 116 is formed around the lower integrated circuit dies 100. The gap-fill layer 116 may be an insulating layer and may be formed of a dielectric material, such as silicon oxide, PSG, BSG, BPSG, a TEOS based oxide, or the like, which may be formed by a suitable deposition process such as CVD, ALD, or the like. Initially, the gap-fill layer 116 may cover the back sides of the lower integrated circuit dies 100. A removal process may be performed to level surfaces of the gap-fill layer 116 with the back side surface of the lower integrated circuit dies 100. In some embodiments, the removal process may include a thinning process such as a chemical-mechanical polishing (CMP) process, a grinding process, an etch-back process, combinations thereof, or the like.

Figure 3:
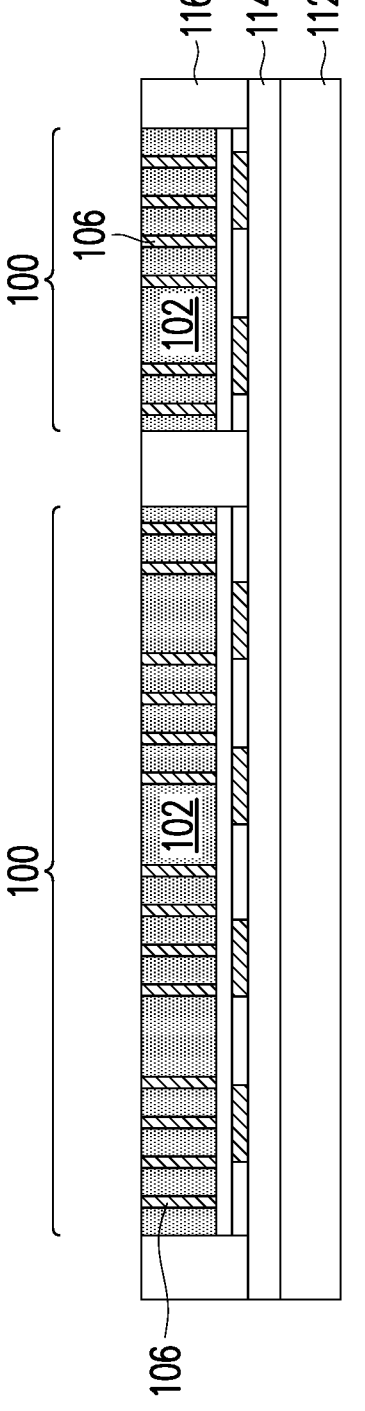

In FIG. 3, the semiconductor substrate 102 of the lower integrated circuit dies 100 are thinned to expose the conductive vias 106. Portions of the gap-fill layer 116 may also be removed by the thinning process. The thinning process may be, a CMP, a grinding process, an etch-back process, combinations thereof, or the like, which is performed at the back sides of the lower integrated circuit dies 100. After the thinning process, surfaces of the gap-fill layer 116, the lower integrated circuit dies 100 (including the semiconductor substrates 102 and the conductive vias 106) are substantially coplanar (within process variations).

Figure 4:
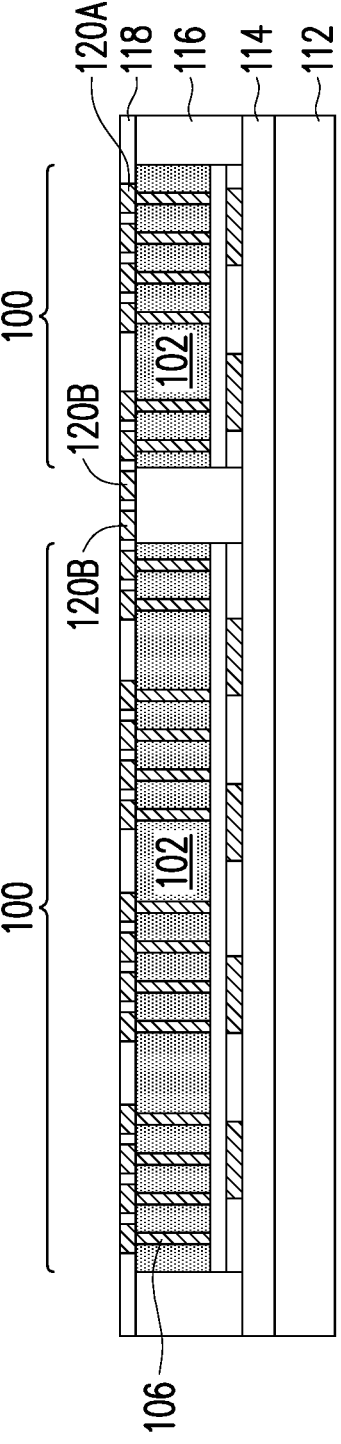

In FIG. 4, a bonding layer 118 is formed on the gap-fill layer 116 and the back sides of the lower integrated circuit dies 100, and die connectors 120 (collectively referring to die connectors 120A and dummy die connectors 120B) are formed in the bonding layer 118. The die connectors 120A may extend through the bonding layer 118 and connect to the conductive vias 106. FIG. 4 further illustrates dummy die connectors 120B formed in the bonding layer 118 over the gap-fill layer 116. The dummy die connectors 120B may aid in the bonding process. The bonding layer 118 may be formed of an oxide such as silicon oxide, PSG, BSG, BPSG, a TEOS based oxide, or the like, which may be formed by a suitable deposition process such as CVD, ALD, or the like. The die connectors 120 may be formed by a damascene process, such as a single damascene process, a dual damascene process, or the like. The die connectors 120 may be formed of a metal, such as copper, aluminum, or the like, which can be formed by plating or the like. In some embodiments, a planarization process such as a CMP, a grinding process, an etch-back process, combinations thereof, or the like, is performed on the bonding layer 118 and the die connectors 120. After the planarization process, surfaces of the bonding layer 118 and the die connectors 120 may be substantially coplanar (within process variations).

Figure 5:
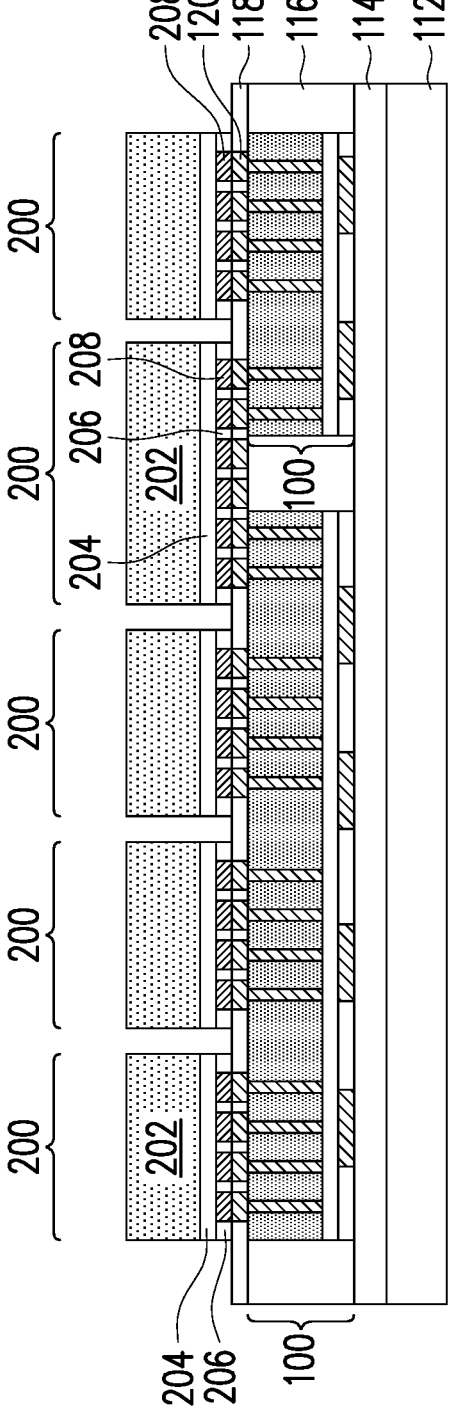

In FIG. 5, upper integrated circuit dies 200 are bonded to the bonding layer 118 and the die connectors 120. In the embodiment illustrated, three upper integrated circuit dies 200 may overlap the lower integrated circuit die 100 on the left in a top-down view, one upper integrated circuit die 200 may overlap the lower integrated circuit die 100 on the right in the top-down view, and one upper integrated circuit die 200 may overlap both the lower integrated circuit die 100 on the left and the lower integrated circuit die 100 on the right in the top-down view (e.g., FIG. 13A). The layout of the upper integrated circuit dies 200 on the bonding layer 118 shown in FIG. 5 is an example, other layouts are contemplated.

Each upper integrated circuit die 200 may be a logic die (e.g., CPU, GPU, SoC, AP, microcontroller, etc.), a memory die (e.g., DRAM die, SRAM die, etc.), a power management die (e.g., PMIC die), a RF die, a sensor die, a MEMS die, a signal processing die (e.g., DSP die), a front-end die (e.g., AFE die), the like, or combinations thereof. The materials and manufacturing processes of the features in the upper integrated circuit dies 200 may be found by referring to the like features in the lower integrated circuit die 100. Each upper integrated circuit die 200 may include a semiconductor substrate 202, which may have an active surface (e.g., the surface facing downwards in FIG. 5), which may be called a front side, and an inactive surface (e.g., the surface facing upwards in FIG. 5), which may be called a back side. Devices (not separately illustrated) may be disposed at the active surface of the semiconductor substrate 202. The devices may be active devices (e.g., transistors, diodes, etc.), capacitors, resistors, or the like. An interconnect structure 204 may be disposed on the active surface of the semiconductor substrate 202. A bonding layer 206 may be disposed on the interconnect structure 204, at the front side of the upper integrated circuit die 200. One or more passivation layer(s) (not separately illustrated) may be disposed between the bonding layer 206 and the interconnect structure 204. Die connectors 208 may extend through the bonding layer 206 may be electrically coupled to the metallization patterns of the interconnect structure 204.

The upper integrated circuit dies 200 may be bonded to the bonding layer 118 and the die connectors 120 by placing the upper integrated circuit dies 200 using a pick-and-place process or the like, then bonding the upper integrated circuit dies 200 to the bonding layer 118 and the die connectors 120. The bonding layers 206 of the upper integrated circuit dies 200 may be directly bonded to the bonding layer 118 through dielectric-to-dielectric bonding, and the die connectors 208 of the upper integrated circuit dies 200 may be directly bonded to respective die connectors 120 through metal-to-metal bonding. The die connectors 208 that are bonded to the dummy die connectors 120B in the gap-fill layer 116 may also be dummy die connectors.

The bonding may include a pre-bonding and an annealing. During the pre-bonding, a small pressing force may be applied to press the upper integrated circuit dies 200 against the bonding layer 118 and the die connectors 120. The pre-bonding may be performed at a low temperature, such as room temperature. After the pre-bonding, the bonding layers 206 may be bonded to the bonding layer 118. The bonding strength may be then improved in a subsequent annealing step at a higher temperature. After the annealing, direct bonds such as dielectric-to-dielectric bonds may be formed, bonding the bonding layers 206 to the bonding layer 118. The die connectors 208 may be bonded to the die connectors 120 with a one-to-one correspondence. The die connectors 208 may be in physical contact with the die connectors 120 after the pre-bonding, or may expand to be brought into physical contact with the die connectors 120 during the annealing. Further, during the annealing, the material of the die connectors 208 may intermingle or bond with the material of the die connectors 120, so that metal-to-metal bonds may be formed.

FIG. 5 illustrates a front-to-back bonding configuration as an example, wherein the back sides of the lower integrated circuit dies 100 face the front sides of the upper integrated circuit dies 200 after bonding. Other bonding configurations may be used, such as a front-to-front bonding configuration or other bonding configuration. In the front-to-front bonding configuration the front sides of lower integrated circuit die 100 may face the front sides of the upper integrated circuit dies 200.

Figure 6:
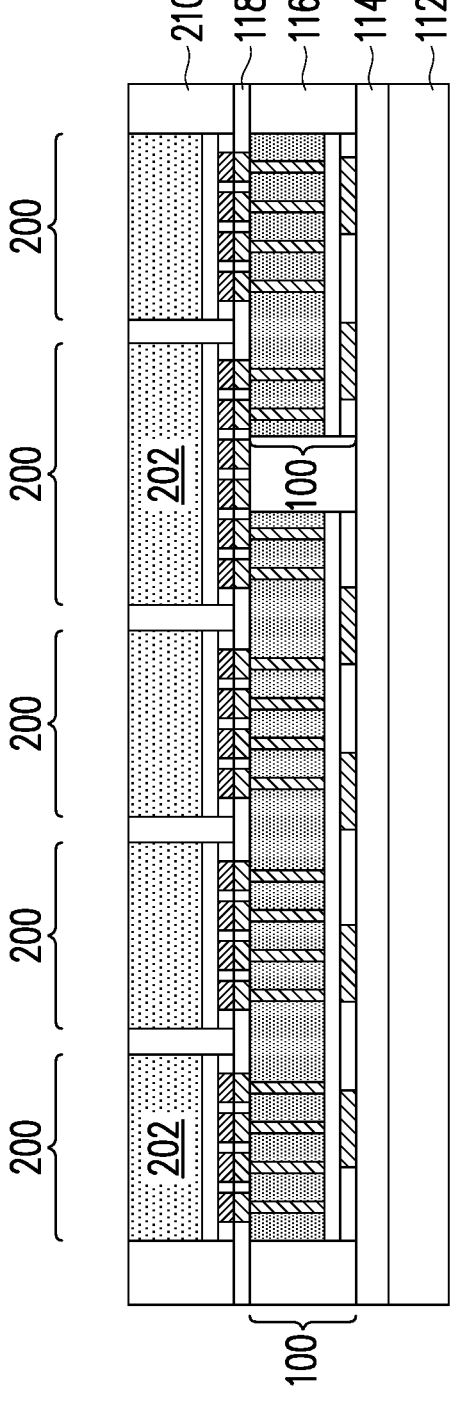

In FIG. 6, a gap-fill layer 210 is formed around the upper integrated circuit dies 200. The gap-fill layer 210 may be formed by a same or similar method and formed of a same or similar dielectric material as the gap-fill layer 116. A thinning process may be performed to remove portions of the semiconductor substrates 202 and the gap-fill layer 210. The thinning process may be, a CMP, a grinding process, an etch-back process, combinations thereof, or the like, which is performed at the back sides of the upper integrated circuit dies 200. After the thinning process, surfaces of the gap-fill layer 210, and the upper integrated circuit dies 200 (including the semiconductor substrates 202) are substantially coplanar (within process variations).

Figure 7:
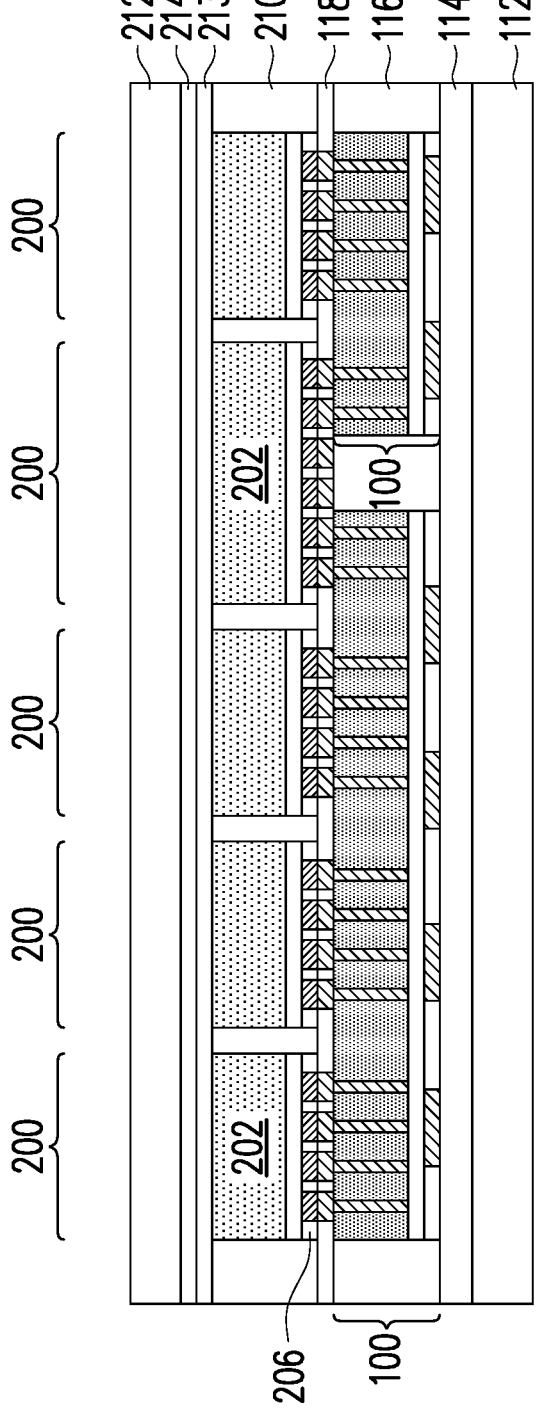

In FIG. 7, a carrier 212 is bonded to the upper surfaces of the semiconductor substrates 202 and the gap-fill layer 210. The carrier 212 may be a semiconductor carrier, a glass carrier, a ceramic carrier, or the like. The carrier 212 may be a wafer having a same or similar size as the carrier 112. In some embodiments, the carrier 212 is bonded to the semiconductor substrates 202 and the gap-fill layer 210 using bonding layers 213 and 214. The bonding layer 213 is formed on the semiconductor substrates 202 and the gap-fill layer 210, and the bonding layer 214 is formed on the carrier 212. The bonding layer 213 and the bonding layer 214 may each comprise a dielectric material, such as silicon dioxide or the like, and may be formed by a suitable deposition process such as CVD, ALD, or the like. The structure over the carrier 112 may be bonded to the carrier 212 by bonding the bonding layer 213 and the bonding layer 214 by a same or similar process used for bonding the bonding layer 118 and the bonding layer 206 described with respect to FIG. 5.

Figure 8:
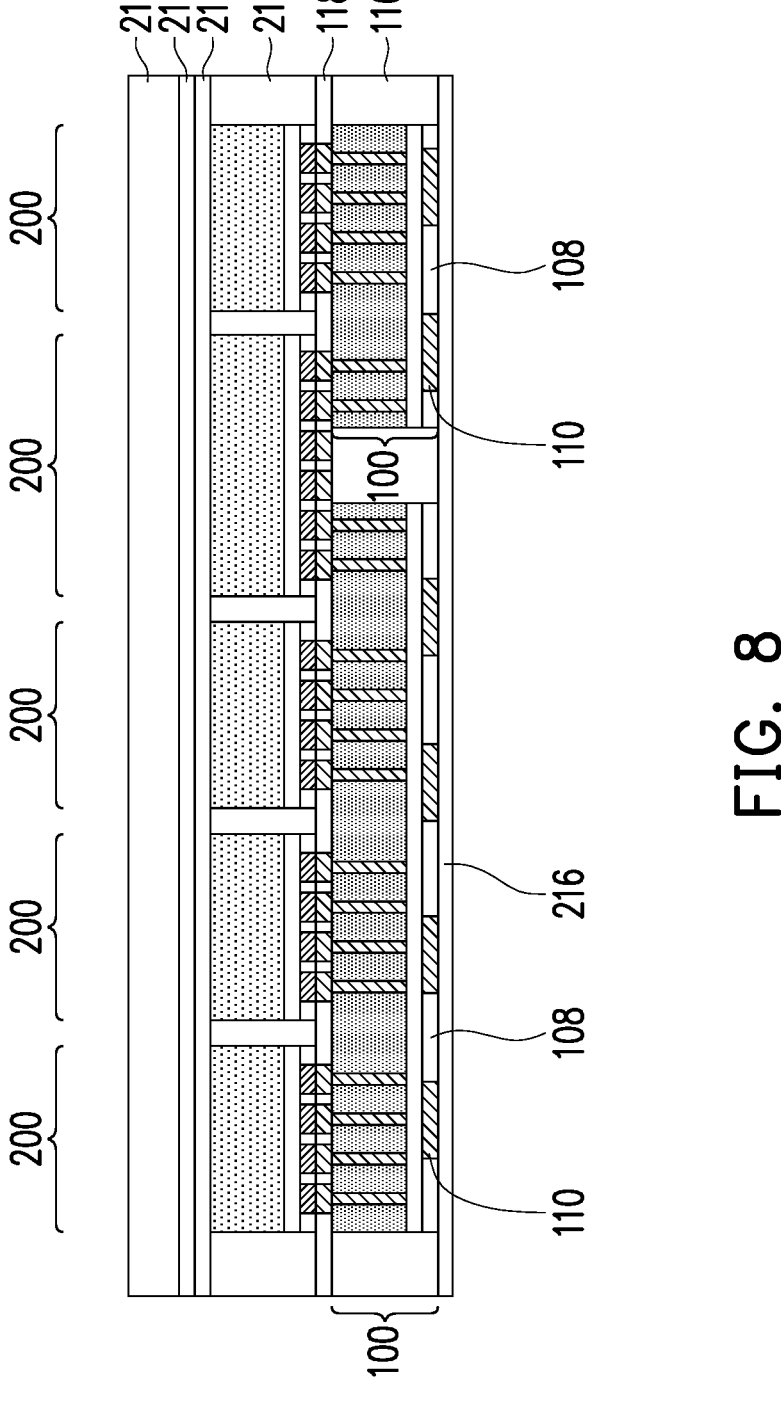

In FIG. 8, the carrier 112 and the adhesive 114 is removed, and a dielectric layer 216 is formed on the gap-fill layer 116 and the front sides of the lower integrated circuit dies 100. The removal process may include projecting a light beam such as a laser beam or a UV light beam on the adhesive 114 (shown in FIG. 7) so that the adhesive 114 decomposes upon exposure to the light beam and the carrier 112 may be removed. In some embodiments, the dielectric layer 216 comprises PBO, polyimide, a BCB-based polymer, or the like, and is formed by a suitable coating process such as spin coating, lamination, or the like. In some embodiments, the dielectric layer 216 comprises silicon dioxide, silicon nitride, or the like, and is formed by a suitable deposition process such as CVD, ALD, or the like. In some embodiments, a redistribution structure (not separately illustrated) may be formed prior to forming the dielectric layer 216 to provide additional routing.

Figure 9:
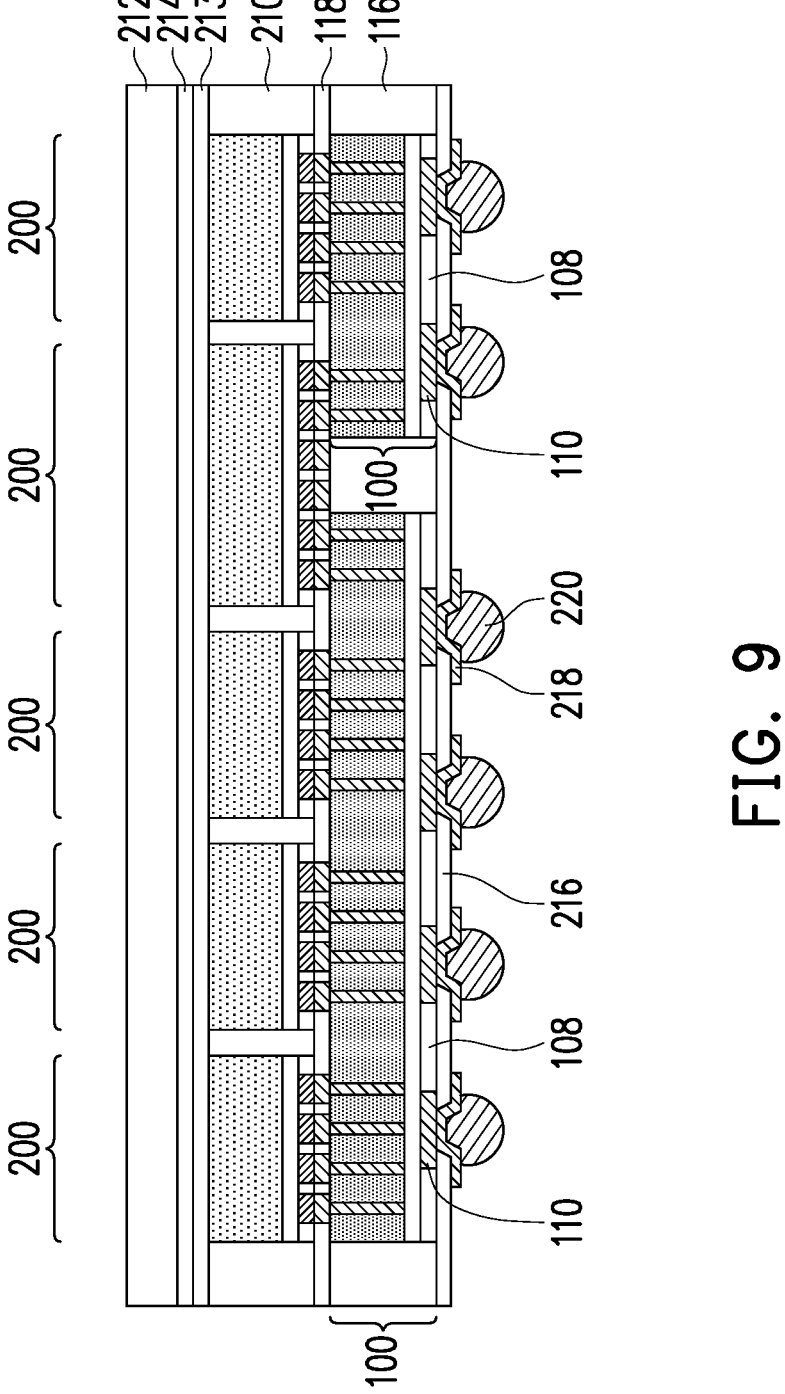

In FIG. 9, under-bump metallizations (UBMs) 218 and electrical connectors 220 are formed. The UBMs 218 may have portions extending along a surface of the dielectric layer 216 and portions extending through the dielectric layer 216 to physically and electrically couple to the die connectors 110 and the die connectors 110. As a result, the UBMs 218 are electrically coupled to the lower integrated circuit dies 100.

As an example to form the UBMs 218, the dielectric layer 216 may be patterned to form openings exposing the underlying die connectors 110 and die connectors 110. The patterning may be done by an acceptable photolithography and etching processes, such as forming a mask then performing an anisotropic etching. The mask may be removed after the patterning. A seed layer (not separately illustrated) may be formed on the dielectric layer 216, in the openings through the dielectric layer 216, and on the exposed portions of the die connectors 110 and the die connectors 110. The seed layer may be a metal layer, which may be a single layer or a composite layer comprising a plurality of sub-layers formed of different materials. In some embodiments, the seed layer comprises a titanium layer and a copper layer over the titanium layer. The seed layer may be formed using a suitable deposition process, such as physical vapor deposition (PVD) or the like. A photoresist may be then formed and patterned on the seed layer. The photoresist may be formed by spin coating or the like and may be exposed to light for patterning. The pattern of the photoresist may correspond to the UBMs 218. The patterning may form openings through the photoresist to expose the seed layer.

A conductive material may be formed in the openings of the photoresist and on the exposed portions of the seed layer. The conductive material may be formed by plating, such as electroless plating, electroplating, or the like. The conductive material may comprise a metal or a metal alloy, such as copper, titanium, tungsten, aluminum, the like, or combinations thereof. Then the photoresist and portions of the seed layer on which the conductive material is not formed may be removed. The photoresist may be removed by an acceptable ashing or stripping process, such as using an oxygen plasma or the like. Once the photoresist is removed, portions of the seed layer on which the conductive material is not formed may be removed by an acceptable etching process, such as by wet or dry etching. The remaining portions of the seed layer and conductive material may form the UBMs 218.

Electrical connectors 220 may be formed on the UBMs 218. The electrical connectors 220 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the electrical connectors 220 comprise a conductive material such as solder, copper, aluminum, gold, nickel, silver, palladium, tin, the like, or a combination thereof. The electrical connectors 220 may be formed by initially forming a layer of solder through evaporation, electroplating, printing, solder transfer, ball placement, or the like. Once the layer of solder has been formed on the structure, a reflow may be performed to shape the solder into the desired bump shapes. In some embodiments, the electrical connectors 220 comprise metal pillars, such as a copper pillar, formed by a sputtering, printing, electroplating, electroless plating, CVD, or the like, which are solder free and have substantially vertical sidewalls. A metal cap layer may be formed on top of the metal pillars. The metal cap layer may include nickel, tin, tin-lead, gold, silver, palladium, indium, nickel-palladium-gold, nickel-gold, the like, or a combination thereof, and may be formed by a plating process.

Figure 10:
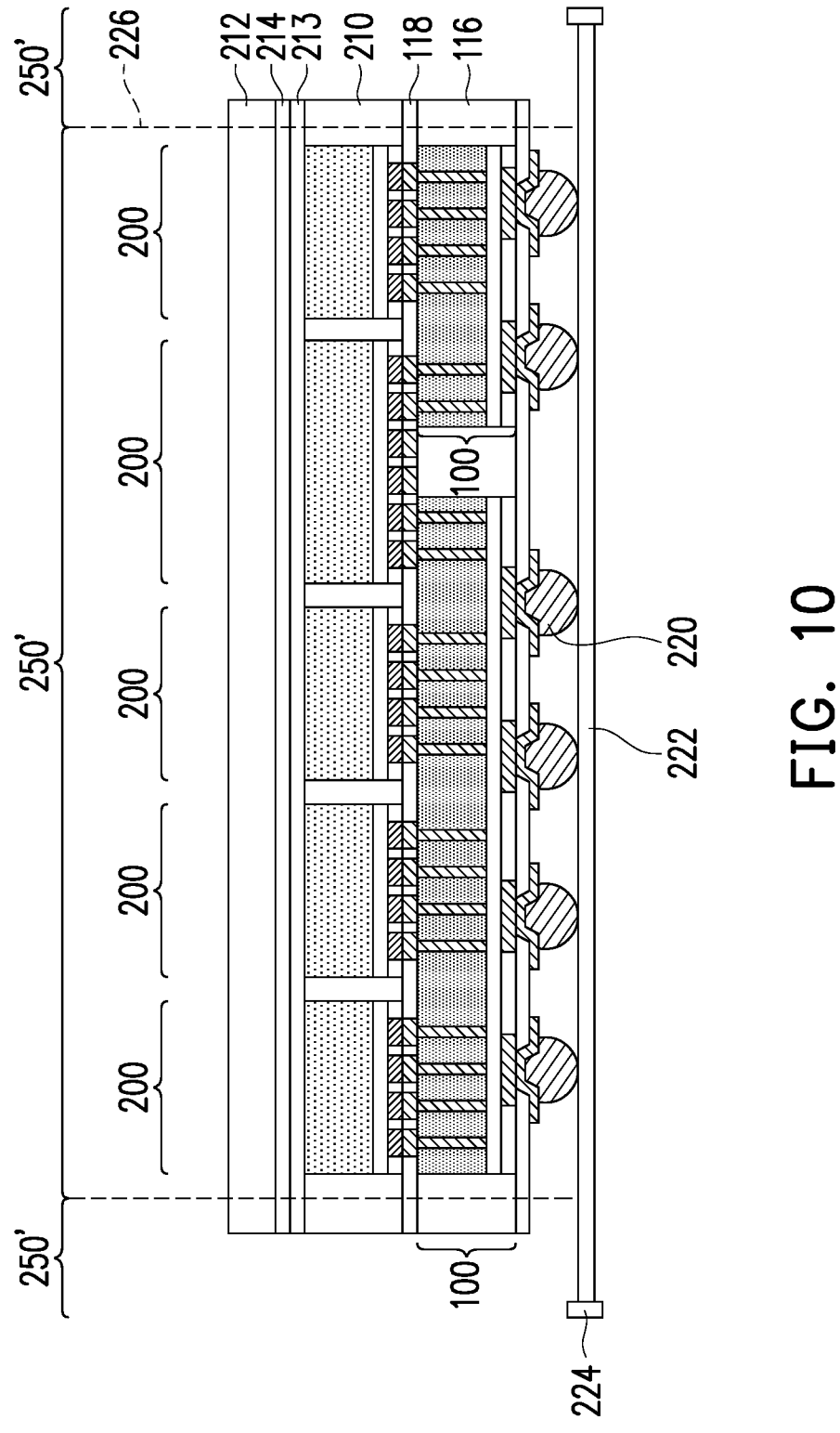

The processes discussed above may be performed using wafer-level processing. The carrier 212 may be a wafer and may include many structures (not separately illustrated) similar to the one illustrated in FIG. 9. As such, the structure shown in FIG. 9 may be referred to as a wafer structure 250 and may be singulated in a subsequent process. For example, in FIG. 10, the wafer structure 250 is singulated to form individual integrated circuit package components 250'. The wafer structure 250 may be placed on a tape 222 supported by a frame 224. The wafer structure 250 may be then singulated along scribe lines 226, so that the wafer structure 250 may be separated into discrete integrated circuit package components 250'. The singulation process may include a sawing process, a laser cutting process, or the like. A cleaning process or rinsing process may be performed after the singulation process.

Figure 11:
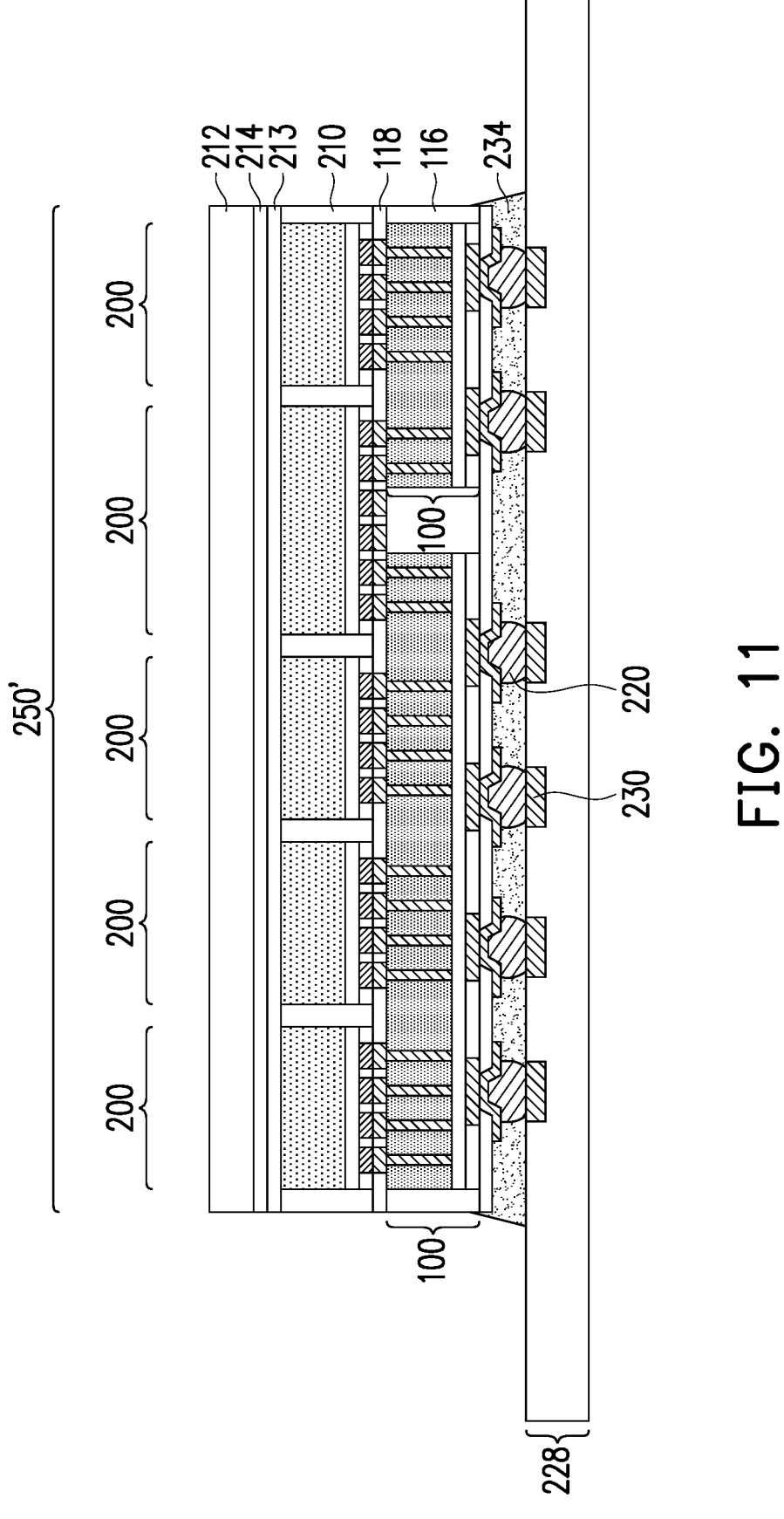

In FIG. 11, the integrated circuit package component 250' is bonded to a package substrate 228 and an underfill 234 is formed between the integrated circuit package component 250' and the package substrate 228. The package substrate 228 may include comprise bond pads 230. In some embodiments, the package substrate 228 comprise materials such as fiberglass reinforced resin, BT resin, other PCB materials, or the like. In some embodiments, the package substrate 228 comprise materials such as silicon, germanium, silicon germanium, silicon carbide, gallium arsenic, indium arsenide, indium phosphide, silicon germanium carbide, gallium arsenic phosphide, gallium indium phosphide, or the like.

The package substrate 228 may include active and passive devices (not separately illustrated), such as transistors, capacitors, resistors, combinations thereof, or the like. The devices may be formed using any suitable methods. The package substrate 228 may comprise metallization layers and vias (not separately illustrated) physically and electrically coupled to the bond pads 232. The metallization layers may be formed over the active and passive devices and may connect the various devices to form functional circuitry. The metallization layers may be alternating layers of dielectric material (e.g., low-k dielectric material) and conductive material (e.g., copper) with vias interconnecting the layers of conductive material. In some embodiments, the package substrate 228 is free of active and passive devices.

During the bonding process the electrical connectors 220 may be reflowed to bond the integrated circuit package component 250' to the bond pads 230. The electrical connectors 220 may electrically and physically couple the package substrate 228 to the integrated circuit package component 250'. In some embodiments, a solder resist (not separately illustrated) is formed on the package substrate 228. The electrical connectors 220 may be disposed in openings in the solder resist to electrically and physically couple to the bond pads 230. The solder resist may be used to protect areas of the package substrate 228 from external damage.

The underfill 234 may surround the electrical connectors 220 and protect the joints resulting from the reflowing of the electrical connectors 220. The underfill 234 may encircle the integrated circuit package component 250' in a top-down view. The underfill 234 may be formed by a capillary flow process after the integrated circuit package component 250' is attached or by a suitable deposition method before the integrated circuit package component 250' is attached. The underfill 234 may be subsequently cured.

Figure 12:
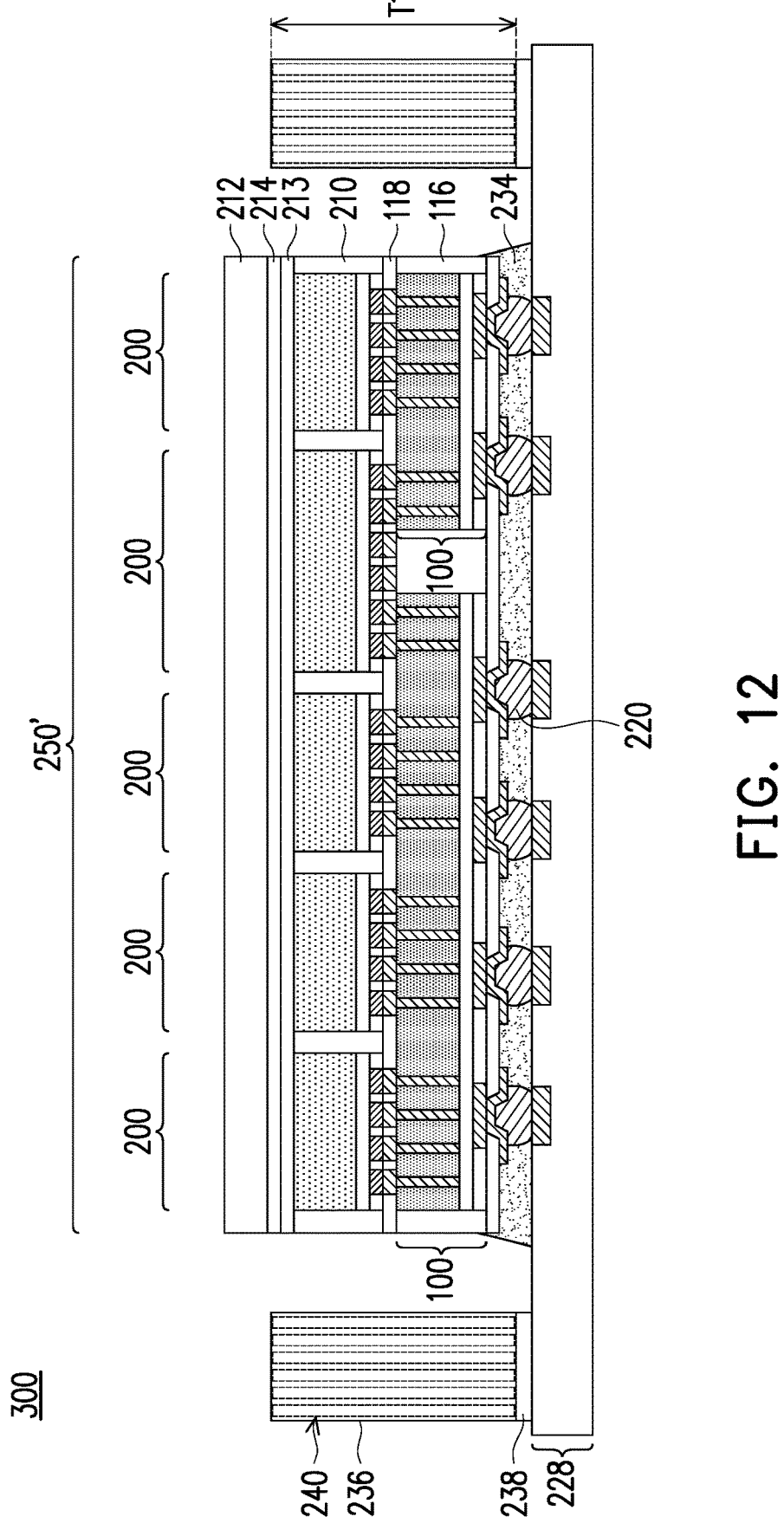

In FIG. 12, a stiffener ring 236 is attached to the package substrate 228 by an adhesive 238. The resulting structure may be referred to as the integrated circuit package 300. The stiffener ring 236 may have high stiffness and/or hardness and may reduce warpage or other types of deformation of the package substrate 228. The stiffener ring 236 may comprise a material with high stiffness and/or hardness, such as metallic materials. In some embodiment, the stiffener ring 236 comprises stainless steel (e.g., SUS304) or copper. The stiffener ring 236 may have a thickness T1 in a range from about 0.45 mm to about 0.55 mm, such as about 0.5 mm. The stiffener ring 236 may have openings 240 (e.g., perforations) in one or more perforated regions of the stiffener ring 236, which may reduce the stiffness and/or hardness of the stiffener ring 236 in the perforated regions, thereby reducing the risk of the cracking of the electrical connectors 220 adjacent the perforated regions as discuss in greater details below. The openings 240 may extend completely through the stiffener ring 236 (e.g., from a top surface to a bottom surface of the stiffener ring 236) in a direction parallel with sidewalls of the stiffener ring 236 and perpendicular to the package substrate 228. Portions of the adhesive 238 may remain exposed through the openings 240 after the stiffener ring 236 is attached to the package substrate 228.

Figure 13A:
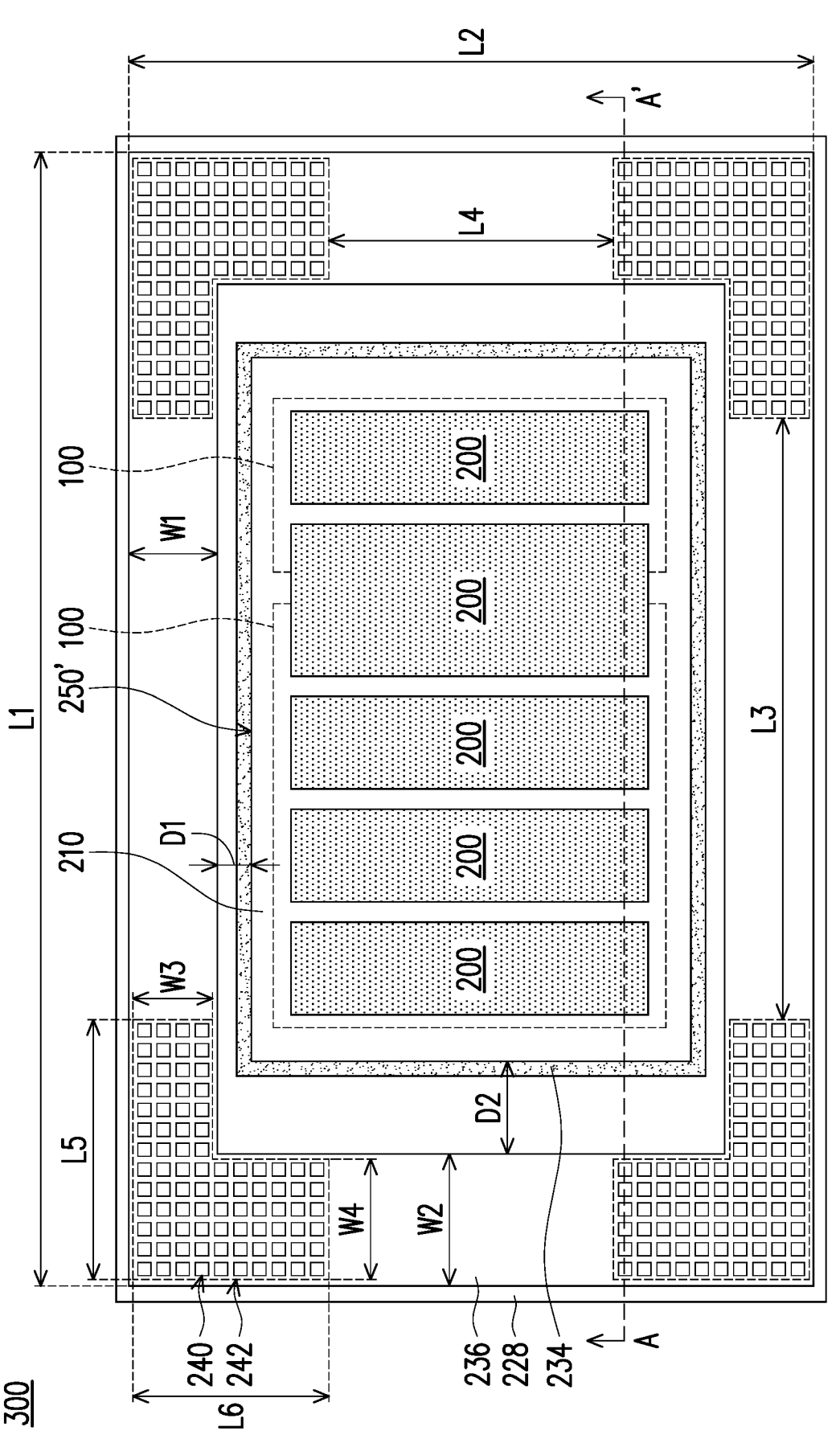
Figure 13B:
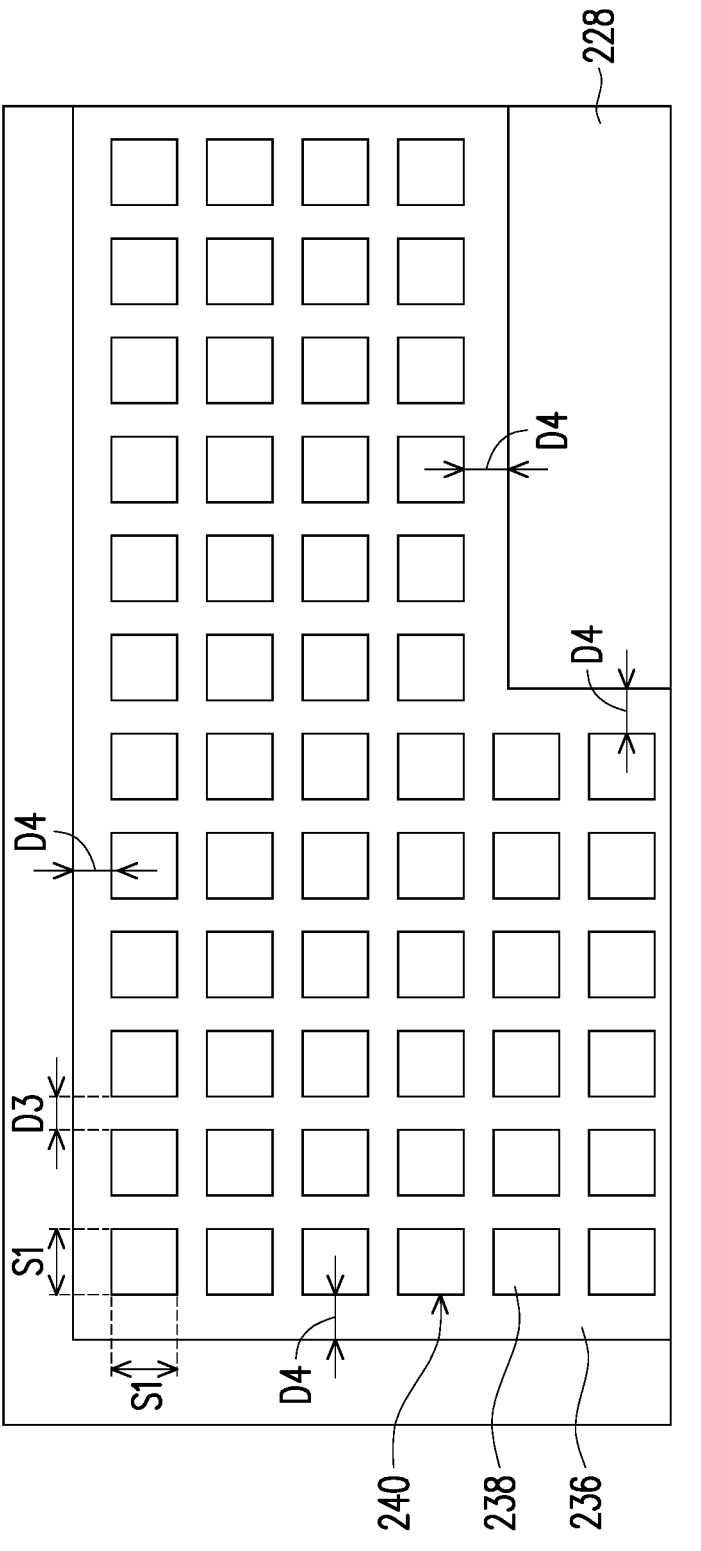

FIG. 13A shows a top-down view of the integrated circuit package 300 shown in FIG. 12 and FIG. 13B shows a portion of the stiffener ring 236 illustrated in FIG. 13A, wherein like reference numerals refer to like features. The cross-sectional view of the integrated circuit package 300 shown in FIG. 12 can be obtained along reference cross-section A-A' in FIG. 13A. The perforation regions 242 may be positioned in regions of the stiffener ring 236 (e.g., corner regions) where the stiffener ring 236 may induce high stress to nearby electrical connectors 220 and increase the risk of the cracking of the nearby electrical connectors 220. The portions of the stiffener ring 236 in the perforated regions 242 may have reduced stiffness and/or hardness compared to other portions of the stiffener ring 236, which may reduce the risk of the cracking of the electrical connectors 220 adjacent the perforated regions 242.

FIG. 13A illustrates an embodiment in which the integrated circuit package component 250' has a shape of a rectangle, which is greater in length along the horizontal direction than along the vertical direction, and the stiffener ring 236 has a shape of a frame encircling the integrated circuit package component 250' and the underfill 234. The integrated circuit package component 250' may be separated from the vertical portions of the stiffener ring 236 by a same or different distance than the horizontal portions of the stiffener ring 236. Two intersecting sides of the stiffener ring 236 may form a corner region of the stiffener ring 236. The stiffener ring 236 may comprise four perforation regions 242, one in each corner region of the stiffener ring 236. As shown in FIG. 13A, the perforated regions 242 may extend along intersecting sidewalls of a corner of the stiffener ring 236, forming a bracket or an "L" shape in the top-down view.

A distance that the perforation regions 242 extends along each sidewall may be the same or different. In some embodiments, each of the perforation regions 242 may extend from a corner of the stiffener ring 236 along a side of the stiffener ring 236 by a distance that is larger than or equal to a width of an adjacent side of the stiffener ring 236 and smaller than or equal to about 30% of a length of the side of the stiffener ring 236. For example, the stiffener ring 236 may have a longer side (e.g., along the horizontal direction in FIG. 13A) with a length L1 and a width W1, and a shorter side (e.g., along the vertical direction in FIG. 13A) adjacent the longer side with a length L2 and a width W2. The perforation region 242 may have a length L5 along the longer side of the stiffener ring 236, which may be larger than or equal to the width W2 and smaller than or equal to about 30% of the length L1. As a result, a distance L3 between the perforation regions 242 along the longer side may be larger than or equal to about 40% of the length L1. Similarly, the perforation region 242 may have a length L6 along the shorter side of the stiffener ring 236, which may be larger than or equal to the width W1 and smaller than or equal to about 30% of the length L2. As a result, a distance L4 between the perforation regions 242 along the shorter side may be larger than or equal to about 40% of the length L2.

FIG. 13A illustrates an embodiment in which the perforation regions 242 extend through entire widths of the stiffener ring 236, e.g., a width W3 of the perforation region 242 is about equal to the width W1 of the longer side of the stiffener ring 236 and a width W4 of the perforation region 242 is about equal to the width W2 of the shorter side of the stiffener ring 236. In some embodiments, the perforation regions 242 may have a width less than the corresponding width of the stiffener ring 236, e.g., the width W3 of the perforation region 242 is less than the width W1 of the longer side of the stiffener ring 236 and the width W4 of the perforation region 242 is less than the width W2 of the shorter side of the stiffener ring 236. FIG. 13A illustrates an embodiment in which the perforation regions 242 have a similar shape, though in other embodiments, one or more of the perforation regions may be different from the others.

The sides of the stiffener ring 236 may have a same width or different widths in a top-down view. In some embodiments, the stiffener ring 236 may have a greater width along the direction of the larger dimension of the integrated circuit package component 250'. For example, FIG. 13A illustrates an embodiment in which the integrated circuit package component 250' is greater in length along the horizontal direction than along the vertical direction, and accordingly, the width W2 of the stiffener ring 236 in the horizontal direction (e.g., the width W2 of the shorter side of the stiffener ring 236) is greater than the width W1 of the stiffener ring 236 along the vertical direction (e.g., the width W1 of the longer side of the stiffener ring 236). Due to the shape of the integrated circuit package component 250' in the illustrated embodiment, the package substrate 228 may also have a larger dimension along the direction of the larger dimension of the integrated circuit package component 250'. As a result, the package substrate 228 may exhibit greater warpage or other types of deformation along the direction of the larger dimension of the package substrate 228. Configuring the stiffener ring 236 to have a greater width along the direction of the larger dimension of the package substrate 228 may reduce warpage or other types of deformation of the package substrate 228.

The stiffener ring 236 may be spaced apart from the integrated circuit package component 250'. The distance between the stiffener ring 236 and the integrated circuit package component 250' may be the same or different along the horizontal direction and vertical direction. In some embodiments, the stiffener ring 236 may be spaced apart from the integrated circuit package component 250' by a greater distance along the direction of the larger dimension of the integrated circuit package component 250'. For example, FIG. 13A illustrates an embodiment in which the integrated circuit package component 250' is greater in length along the horizontal direction than along the vertical direction, and accordingly, a distance D2 in the horizontal direction from the integrated circuit package component 250' to the shorter side of stiffener ring 236 is greater than a distance D1 along the vertical direction from the integrated circuit package component 250' to the longer side of stiffener ring 236. Since the stiffener ring 236 has a greater width along the direction of the larger dimension of the integrated circuit package component 250', the electrical connectors 220 of the integrated circuit package component 250' adjacent the side of the stiffener ring 236 with the greater width may have greater stress. Configuring the stiffener ring 236 so that the integrated circuit package component 250' is spaced apart from the side of the stiffener ring 236 with the greater width by a greater distance may reduce the risk of the cracking of the electrical connectors 220.

Still referring to FIG. 13A, as an example and not to be limiting, the length L1 of the stiffener ring 236 may be a range from about 54 mm to about 66 mm, such as about 60 mm, and the length L2 of the stiffener ring 236 may be in a range from about 45 mm to about 55 mm, such as about 50 mm. The width W1 of the stiffener ring 236 may be a range from about 6.62 mm to about 8.09 mm, such as about 7.35 mm, and the width W2 of the stiffener ring 236 may be in a range from about 9.7 mm to about 11.9 mm, such as about 10.8 mm. The stiffener ring 236 may be spaced apart from the integrated circuit package component 250' by the distance D1 in the vertical direction in a range from about 2.8 mm to about 3.4 mm, such as about 3.1 mm, and may be spaced apart from the integrated circuit package component 250' by the distance D2 in the horizontal direction in a range from about 5.4 mm to about 6.6 mm, such as about 6 mm.

FIGS. 13A and 13B further illustrate the openings 240 may be arranged in an array within each perforated region 242, which may expose portions of the adhesive 238. The arrangement of the openings 240 illustrated in FIGS. 13A and 13B is an example, different numbers of columns and rows or other patterns, such as staggered rows or the like, are contemplated. The openings 240 may reduce the stiffness and/or hardness of portions of the stiffener ring 236 in the perforated regions 242, which may reduce the risk of the cracking of the electrical connectors 220 adjacent the perforated regions 242 during the subsequent manufacturing and operation, thereby improving the reliability of the integrated circuit package 300.

The openings 240 may have substantially the same shape and dimensions. The openings 240 may have a shape of a polygon, ellipse, or the like. In some embodiments, the openings 240 have a shape of a square with a length S1 in a range between about 0.9 mm to about 1.1 mm, such as about 1 mm. In some embodiments, the openings 240 have a shape of a circle with a diameter in a range between about 0.9 mm to about 1.1 mm, such as about 1 mm. A distance D3 between two neighboring openings 240 may be in a range between about 0.18 mm to about 0.22 mm, such as about 0.2 mm. A distance D4 between the outer columns and rows of the openings 240 and the edges of the stiffener ring 236 may be in a range between about 0.18 mm to about 0.22 mm, such as about 0.2 mm. As a result, the openings 240 may be surrounded by the material of the stiffener ring 236 in the top down view and the inner and outer sidewalls of the stiffener ring 236 may be free of indentations.

Figure 14:
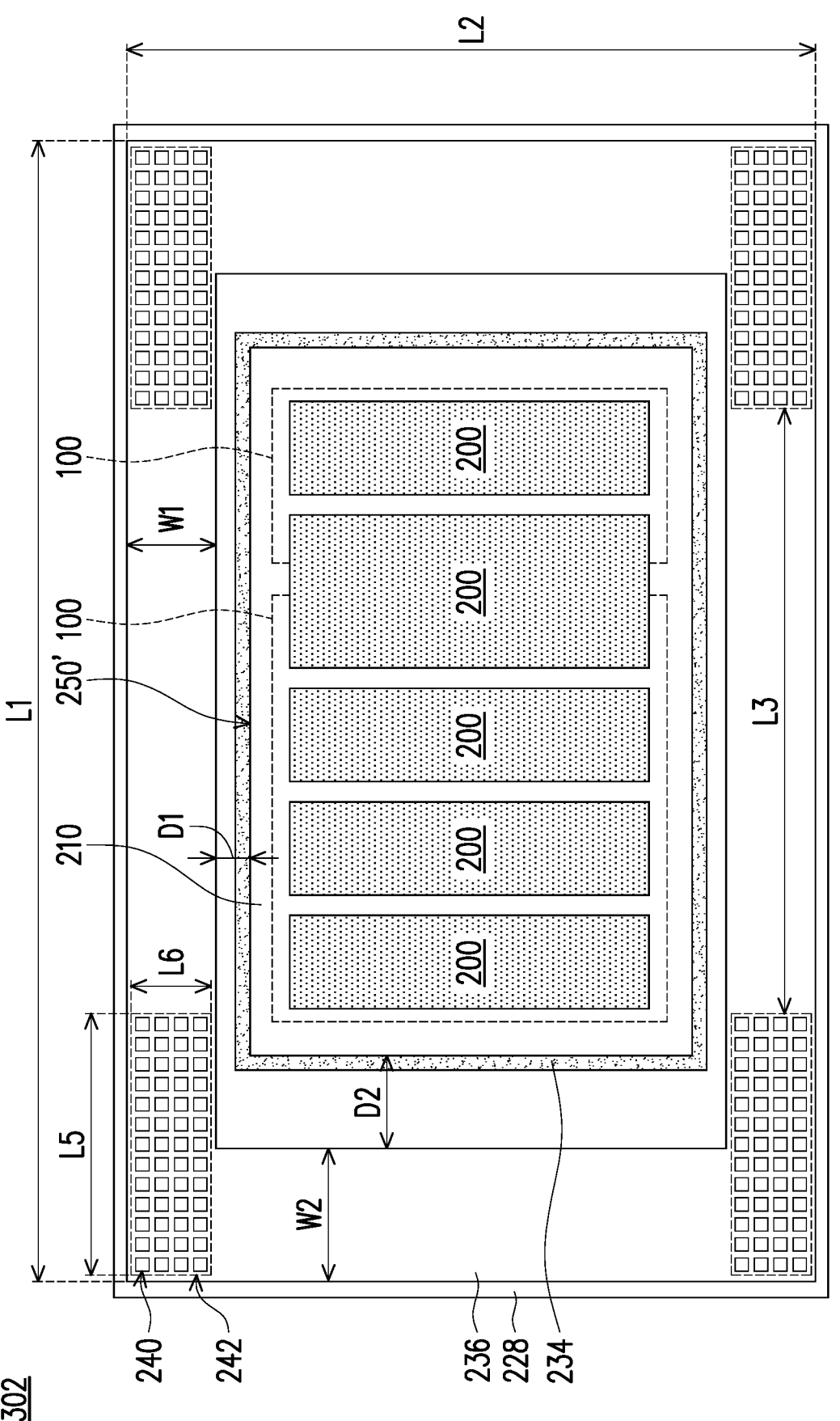
Figure 15:
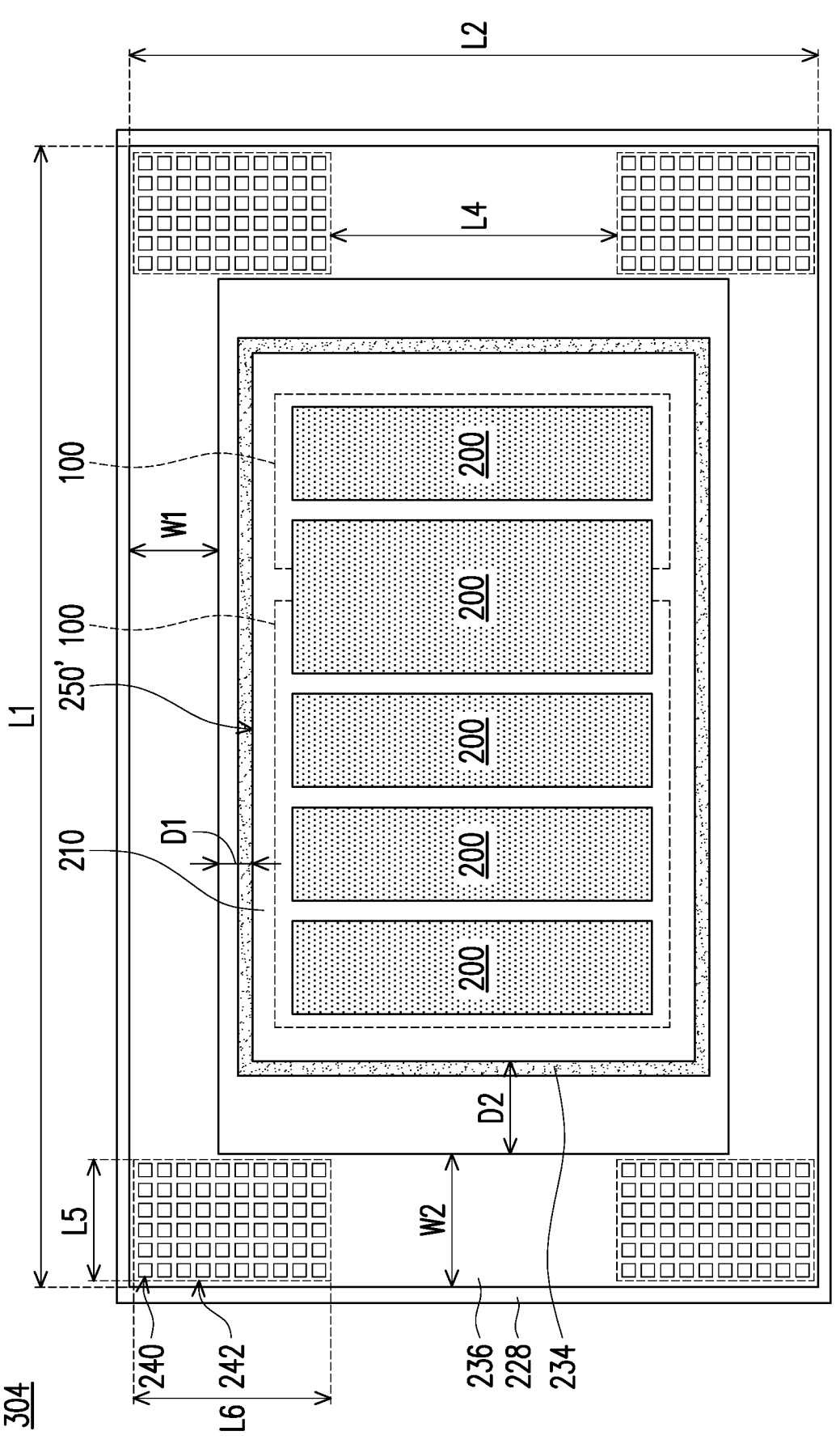

FIGS. 14 and 15 provided additional examples of shapes of the perforated regions 242. Referring first to FIG. 14, there is shown an integrated circuit package 302 similar to the integrated circuit package 300 shown in FIG. 13A, wherein like reference numerals refer to like features. In FIG. 14, each perforated region 242 has a shape of a rectangle disposed in a corresponding corner region of the stiffener ring 236 such that the rectangle extends further along one side (e.g., the horizontal side) than the other side (e.g., the vertical side). FIG. 15 shows an integrated circuit package 304 similar to the integrated circuit package 300 shown in FIG. 13A, wherein like reference numerals refer to like features. In FIG. 15, each perforated region 242 has a shape of a rectangle disposed in a corresponding corner region of the stiffener ring 236 such that the rectangle extends further along one side (e.g., the vertical side) and the other side (e.g., the horizontal side). Other configurations of the perforated regions 242 may be used.

Various embodiments are described above in the context of a system on integrated chips (SoIC) package configuration. It should be understood that various embodiments may also be adapted to apply to other package configurations, such as integrated fan-out on substrate (InFO), chip on wafer on substrate (CoWoS) or the like.

The embodiments may have some advantageous features. By including the stiffener ring 236 in integrated circuit package 300, wherein the openings 240 are disposed in the perforated regions 242 of the stiffener ring 236, the risk of the cracking of the electrical connectors 220 adjacent the perforated regions 242 of the stiffener ring 236 may be reduced during the manufacturing and operation of the integrated circuit package 300. A reduced risk of the cracking of the electrical connectors 220 may lead to better reliability of the integrated circuit package 300.

In an embodiment, a semiconductor package includes an integrated circuit package component on a substrate, wherein the integrated circuit package component includes an integrated circuit die; an underfill between the integrated circuit package component and the substrate; and a stiffener ring attached to the substrate, wherein the stiffener ring encircles the integrated circuit package component and the underfill in a top-down view, wherein the stiffener ring includes a perforated region, wherein the perforated region includes an array of openings extending from a top surface of the stiffener ring to a bottom surface of the stiffener ring.

In an embodiment, the stiffener ring has a first side intersecting a second side to form a corner region, wherein the perforated region is in the corner region of the stiffener ring the top-down view. In an embodiment, the stiffener ring has a first width along the first side and a second width along the second side, and wherein a first length of the perforated region along the first side is greater than the second width. In an embodiment, a second length of the perforated region along the second side is equal to the first width. In an embodiment, the stiffener ring has a first length along the first side, and wherein a length of the perforation region along the first side is smaller than or equal to 30% of the first length. In an embodiment, the perforated region has a shape of a bracket. In an embodiment, a length of the perforation region extending along the first side is smaller than or equal to 30% of a length of the first side and wherein a length of the perforation region extending along the second side is smaller than or equal to 30% of a length of the second side. In an embodiment, the stiffener ring includes a metallic material.

In an embodiment, a semiconductor package includes a substrate; a package component bonded to the substrate by electrical connectors, the package component including an integrated circuit die; an underfill between the substrate and the package component, wherein the underfill surrounds the electrical connectors; and a frame structure attached to the substrate, wherein the frame structure encircles the package component in a top-down view, wherein the frame structure includes a perforated region at each corner of the frame structure in the top-down view, and wherein each perforated region includes a first perforation extending through a thickness of the frame structure. In an embodiment, each perforated region has a shape of an "L". In an embodiment, the first perforation has a shape of a polygon in the top-down view. In an embodiment, the first perforation has a shape of an ellipse in the top-down view. In an embodiment, each perforated region includes an array of first perforations.

In an embodiment, a method of forming a semiconductor package includes bonding a first side of a package component to a substrate; forming an underfill between the package component and the substrate; and attaching a ring structure to the substrate, wherein the ring structure encircles the package component in a top-down view, wherein a first opening is disposed in a first perforated region of the ring structure, and wherein the first perforated region is disposed in a first corner region of the ring structure. In an embodiment, the first opening extends in a direction perpendicular to the substrate. In an embodiment, sidewalls of the ring structure are free of indentations. In an embodiment, the ring structure includes a metallic material. In an embodiment, the ring structure includes a second opening disposed in a second perforated region of the ring structure, and wherein the second perforated region is disposed in a second corner region of the ring structure. In an embodiment, the first perforated region and the second perforated region are on a first side of the ring structure, wherein a distance between the first perforated region and the second perforated region is larger than or equal to 40% of a length of the first side of the ring structure. In an embodiment, attaching the ring structure includes attaching the ring structure to the substrate using an adhesive, and wherein the first opening exposes a portion of the adhesive in the top-down view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
an integrated circuit package component on a substrate, wherein the integrated circuit package component comprises an integrated circuit die;
an underfill between the integrated circuit package component and the substrate; and
a stiffener ring attached to the substrate, wherein the stiffener ring encircles the integrated circuit package component and the underfill in a top-down view, wherein the stiffener ring has a first side and a second side intersecting to form a corner region, wherein the stiffener ring comprises a perforated region in the corner region in the top-down view, wherein the perforated region comprises an array of openings extending from a top surface of the stiffener ring to a bottom surface of the stiffener ring, and wherein the array of openings comprises a plurality of columns of openings and a plurality of rows of openings.

2. The semiconductor package of claim 1, wherein the stiffener ring is attached to the substrate by an adhesive, and wherein the array of openings exposes the adhesive in the top-down view.

3. The semiconductor package of claim 1, wherein the stiffener ring has a first width along the first side and a second width along the second side, and wherein a first length of the perforated region along the first side is greater than the second width.

4. The semiconductor package of claim 3, wherein a second length of the perforated region along the second side is equal to the first width.

5. The semiconductor package of claim 1, wherein the stiffener ring has a first length along the first side, and wherein a length of the perforation region along the first side is smaller than or equal to 30% of the first length.

6. The semiconductor package of claim 1, wherein the perforated region has a shape of a bracket.

7. The semiconductor package of claim 6, wherein a length of the perforation region extending along the first side is smaller than or equal to 30% of a length of the first side and wherein a length of the perforation region extending along the second side is smaller than or equal to 30% of a length of the second side.

8. The semiconductor package of claim 1, wherein the stiffener ring comprises a metallic material.

9. A semiconductor package comprising:
a substrate;
a package component bonded to the substrate by electrical connectors, the package component comprising:

an integrated circuit die;
an encapsulant around the integrated circuit die; and
a semiconductor substrate over the integrated circuit die and the encapsulant;
an underfill between the substrate and the package component, wherein the underfill surrounds the electrical connectors; and
a frame structure attached to the substrate, wherein the frame structure encircles the package component in a top-down view, wherein the frame structure comprises a perforated region at each corner of the frame structure in the top-down view, and wherein each perforated region comprises a first perforation extending through a thickness of the frame structure.

10. The semiconductor package of claim 9, wherein each perforated region has a shape of an "L".

11. The semiconductor package of claim 9, wherein the first perforation has a shape of a polygon in the top-down view.

12. The semiconductor package of claim 9, wherein the first perforation has a shape of an ellipse in the top-down view.

13. The semiconductor package of claim 9, wherein each perforated region comprises an array of first perforations.

14. The semiconductor package of claim 9, wherein the frame structure is attached to the substrate by an adhesive, and wherein the first perforation exposes the adhesive in the top-down view.

15. A method of forming a semiconductor package, the method comprising:
bonding a first side of a package component to a substrate;
forming an underfill between the package component and the substrate; and
attaching a ring structure to the substrate using an adhesive, wherein the ring structure encircles the package component in a top-down view, wherein a first opening is disposed in a first perforated region of the ring structure, wherein the first opening exposes a portion of the adhesive in the top-down view, and wherein the first perforated region is disposed in a first corner region of the ring structure.

16. The method of claim 15, wherein the first opening extends in a direction perpendicular to the substrate.

17. The method of claim 15, wherein sidewalls of the ring structure are free of indentations.

18. The method of claim 15, wherein the ring structure comprises a metallic material.

19. The method of claim 15, wherein the ring structure comprises a second opening disposed in a second perforated region of the ring structure, and wherein the second perforated region is disposed in a second corner region of the ring structure.

20. The method of claim 19, wherein the first perforated region and the second perforated region are on a first side of the ring structure, wherein a distance between the first perforated region and the second perforated region is larger than or equal to 40% of a length of the first side of the ring structure.

* * * * *